(12) United States Patent
Hatem (10) Patent No.: US 11,721,530 B2
(45) Date of Patent: Aug. 8, 2023

(54) SYSTEM FOR CONTROLLING RADICALS USING A RADICAL FILTER

(71) Applicant: Applied Materials, Inc., Santa Clara, CA (US)

(72) Inventor: Christopher R. Hatem, Seabrook, NH (US)

(73) Assignee: Applied Materials, Inc., Santa Clara, CA (US)

( * ) Notice: Subject to any disclaimer, the term of this patent is extended or adjusted under 35 U.S.C. 154(b) by 690 days.

(21) Appl. No.: 16/801,731

(22) Filed: Feb. 26, 2020

(65) Prior Publication Data

US 2021/0265139 A1    Aug. 26, 2021

(51) Int. Cl.
*H01J 37/32*    (2006.01)
*H01J 37/317*    (2006.01)

(52) U.S. Cl.
CPC .... *H01J 37/32596* (2013.01); *H01J 37/3171* (2013.01); *H01J 37/32422* (2013.01); *H01J 37/32449* (2013.01); *H01J 2237/2001* (2013.01)

(58) Field of Classification Search
CPC ............ H01J 37/32596; H01J 37/3171; H01J 37/32422; H01J 37/32449; H01J 37/32357; H01J 2237/2001

USPC .......................................... 204/192.3–192.34
See application file for complete search history.

(56) References Cited

U.S. PATENT DOCUMENTS

| | | | | |
|---|---|---|---|---|
| 4,874,459 A | * | 10/1989 | Coldren | H01J 37/3053 438/711 |
| 2012/0168082 A1 | * | 7/2012 | Izuo | H01J 37/3255 156/345.44 |
| 2019/0393019 A1 | * | 12/2019 | Hatem | H01L 21/67028 |

FOREIGN PATENT DOCUMENTS

CN    101170052 B    *    7/2010

OTHER PUBLICATIONS

Translation of CN 101170052 B (Year: 2010).*

* cited by examiner

*Primary Examiner* — Rodney G McDonald
(74) *Attorney, Agent, or Firm* — KDW Firm PLLC (57) ABSTRACT

Provided herein are approaches for controlling radicals in proximity to a wafer. In some embodiments, a system may include a radical source operable to generate radicals in proximity to the wafer, and a filter positioned between the radical source and the wafer, wherein the filter includes a first plate operable to control radicals generated by the radical source. The system may further include an ion source operable to deliver an ion beam to the wafer, wherein the ion beam passes outside the filter.

16 Claims, 6 Drawing Sheets

SYSTEM FOR CONTROLLING RADICALS USING A RADICAL FILTER

FIELD OF THE DISCLOSURE

The disclosure relates generally to ion implanters, and more particularly to ion implanters including a radical filter for controlling radicals.

BACKGROUND OF THE DISCLOSURE

In electron beam plasma processing of workpieces such as semiconductor wafers, an electron source produces a sheet electron beam, which is then injected into a processing chamber. As the electron beam propagates through the chamber, it produces a plasma having low plasma electron temperature and a low plasma ion energy. Such plasma is useful for etching, cleaning, and other applications. However, due to the low electron temperature of the plasma electrons and small dissociation cross-section for many molecules at beam electron energies (~1000-3000 eV), the dissociation of many gas molecules, e.g., $Cl_2$ or $NF_3$ or $SF_6$, is not sufficient. For some critical applications, i.e. silicon etch, which require significant amount of Cl or F radicals, another means of radical generation is needed.

Another problem is metal contamination in the plasma. A direct-current (dc) electron beam plasma source must include exposed metal surfaces, which provide current continuity required for steady-state operation. Some of these surfaces typically experience bombardment by energetic ions, and may include, for example: (1) the interior surfaces of the electron source discharge chamber, where electrons are generated before being extracted to form the beam; and (2) the surface of the extraction grid facing the processing chamber. In the source discharge chamber, there is a cathode sheath at the surface with a substantial voltage drop (e.g., about 250 eV) in which ions are accelerated towards the metal interior surface. In turn, ions that diffuse into the acceleration gap are picked up by the electric field that accelerates electrons of the beam towards the processing chamber. As a result, these ions are accelerated to significant energies (e.g., on the order of 2 keV) towards the extraction grid. In both the discharge chamber and the acceleration gap, these fast ions bombard the metal surfaces and cause sputtering, so that sputtered metal atoms emerge from the electron beam source and propagate with the electron beam. This leads to metal contamination of the processing chamber walls and the workpiece or substrate being processed. Although the ion energy is much higher in the acceleration gap, the ion flux density is probably much higher in the discharge chamber, so sputtering of metal atoms from the discharge chamber surface can also be substantial.

It is with respect to these and other considerations that the present improvements have been needed.

SUMMARY

The Summary is provided to introduce a selection of concepts in a simplified form, the concepts further described below in the Detailed Description. The Summary is not intended to identify key features or essential features of the claimed subject matter, nor is the Summary intended as an aid in determining the scope of the claimed subject matter.

In some embodiments, a system may include a radical source operable to generate radicals in proximity to a wafer, a filter positioned between the radical source and the wafer, wherein the filter includes a first plate operable to control radicals generated by the radical source, and an ion source operable to deliver an ion beam to the wafer, wherein the ion beam passes outside the filter.

In some embodiments, an ion implantation system may include an ion source operable to deliver an ion beam to a wafer, and a radical apparatus downstream of the ion source. The radical apparatus may include a radical source operable to generate radicals in proximity to the wafer. The ion implantation system may further include a filter positioned between the radical source and the wafer, wherein the filter includes a first plate and a second plate for receiving the radicals therebetween.

In some embodiments, a method may include delivering an ion beam and radicals toward a wafer, and controlling the radicals using a filter positioned upstream the wafer, the filter including a first plate and a second plate separated from one another, and the filter receiving the radicals.

The drawings are not necessarily to scale. The drawings are merely representations, not intended to portray specific parameters of the disclosure. The drawings are intended to depict example embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Systems, apparatuses, ion sources, and methods in accordance with the present disclosure will now be described more fully hereinafter with reference to the accompanying drawings, where non-limiting embodiments are shown. The systems, apparatuses, ion sources, and methods may be embodied in many different forms and are not to be construed as being limited to the embodiments set forth herein. Instead, these embodiments are provided so the disclosure will be thorough and complete, and will fully convey the scope of the system and method to those skilled in the art.

Provided herein are approaches for independently controlling ions and radicals within ion implantation systems.

Radicals are highly reactive due to their unfilled outer electron shell, but carry a neutral charge. As a result, radicals are not well suited for typical optics used for controlling ion beam steering, columniation, etc. Embodiments herein address this issue by using a filter, which is operable to steer and/or trap radicals passing therethrough. As will be described in greater detail herein, a temperature and/or charge of one or more plates of the filter may be altered to influence behavior of the radicals. Furthermore, depending on the specific radical being formed, a sticking coefficient will be associated with the radical and any surface material the radical comes into contact with. In one non-limiting example, lowering the temperature of one plate of the filter enhances the sticking coefficient of that plate, which filters out radicals impacting the plate. Conversely, heating a second plate lowers or eliminates the likelihood radicals will attach thereto. Instead, the radicals may be steered away from the heated plate and towards a desired area (e.g., away from the wafer).

Figure 1:
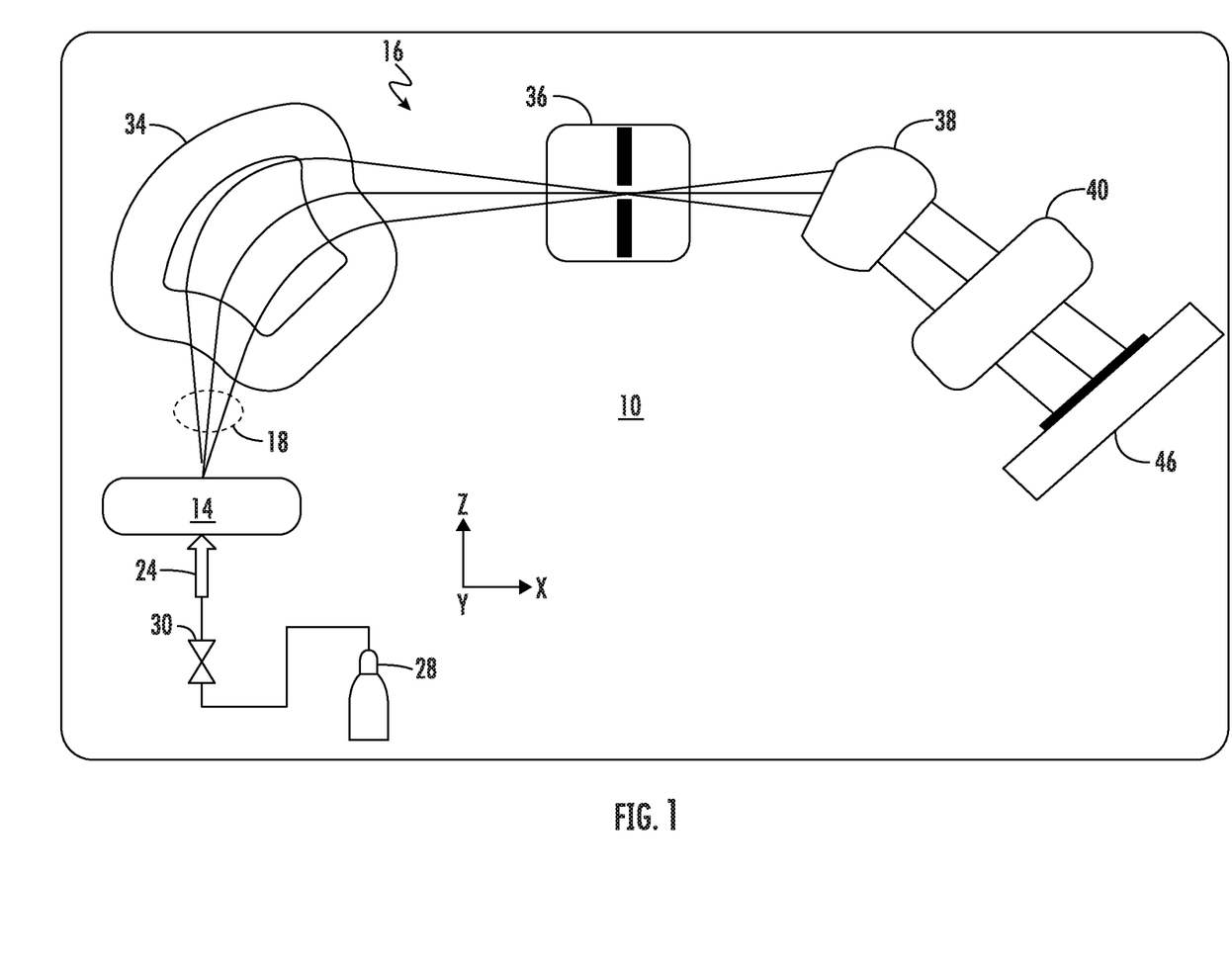
FIG. 1 is a schematic view illustrating an ion implantation system in accordance with embodiments of the present disclosure.

Referring now to FIG. 1, an exemplary system 10 (hereinafter "system") in accordance with the present disclosure is shown. The system 10 represents a process chamber containing, among other components, an ion source 14 for producing an ion beam 18, an ion implanter, and a series of beamline components 16. The ion source 14 may comprise a chamber for receiving a flow of gas 24 and generating ions therein. The ion source 14 may also comprise a power source and an extraction electrode assembly disposed near the chamber. The beamline components 16 may include, for example, a mass analyzer 34, a first acceleration or deceleration stage 36, a collimator 38, and a radical system/apparatus (hereinafter "apparatus") 40. As will be described in greater detail herein, the apparatus 40 may include a radical source and filter for generating and controlling radicals.

In exemplary embodiments, the beamline components 16 may filter, focus, and manipulate ions or the ion beam 18 to have a desired species, shape, energy, and other qualities. The ion beam 18 passing through the beamline components 16 may be directed toward a substrate or wafer mounted on a platen or clamp within a process chamber 46. As appreciated, the substrate may be moved in one or more dimensions (e.g., translate, rotate, and tilt).

As shown, there may be one or more feed sources 28 operable with the chamber of the ion source 14. In some embodiments, material provided from the feed source 28 may include source material and/or additional material. The source material may contain dopant species introduced into the substrate in the form of ions. Meanwhile, the additional material may include diluent, introduced into the ion source chamber of the ion source 14 along with the source material to dilute the concentration of the source material in the chamber of the ion source 14. The additional material may also include a cleaning agent (e.g., an etchant gas) introduced into the chamber of the ion source 14 and transported within the system 10 to clean one or more of the beamline components 16.

In various embodiments, different species may be used as the source and/or the additional material. Examples of the source and/or additional material may include atomic or molecular species containing boron (B), carbon (C), oxygen (O), germanium (Ge), phosphorus (P), arsenic (As), silicon (Si), helium (He), neon (Ne), argon (Ar), krypton (Kr), nitrogen (N), hydrogen (H), fluorine (F), and chlorine (Cl). Those of ordinary skill in the art will recognize the above listed species are non-limiting, and other atomic or molecular species may also be used. Depending on the application(s), the species may be used as the dopants or the additional material. In particular, one species used as the dopants in one application may be used as the additional material in another application, or vice-versa.

In exemplary embodiments, the source and/or additional material is provided into the ion source chamber of the ion source 14 in gaseous or vapor form. If the source and/or additional material is in non-gaseous or non-vapor form, a vaporizer (not shown) may be provided near the feed source 28 to convert the material into gaseous or vapor form. To control the amount and the rate the source and/or the additional material is provided into the system 10, a flowrate controller 30 may be provided.

Although non-limiting, the ion source 14 may include a power generator, plasma exciter, plasma chamber, and the plasma itself. The plasma source may be an inductively-coupled plasma (ICP) source, toroidal coupled plasma source (TCP), capacitively coupled plasma (CCP) source, helicon source, electron cyclotron resonance (ECR) source, indirectly heated cathode (IHC) source, glow discharge source, electron beam generated ion source, or other plasma sources known to those skilled in the art.

The ion source 14 may generate the ion beam 18 for processing a substrate. In various embodiments, the ion beam (in cross-section) may have a targeted shape, such as a spot beam or ribbon beam, as known in the art. In order to process the substrate, the ion beam 18 may be accelerated or decelerated to acquire a target energy by establishing a voltage (potential) difference between the ion source 14 and the wafer.

An important benefit of the combination of the ion source 14 with the independent apparatus 40 is that it provides more degrees of freedom to better control the species of plasma in the main chamber across significantly broad processing conditions. By carefully tuning the low energy plasma and rate of inflow of radicals, unique processes can be achieved. Another benefit is that the electron beam plasma and apparatus 40 can be operated either sequentially or simultaneously, which enables the processing chamber significant flexibilities.

Figure 2:
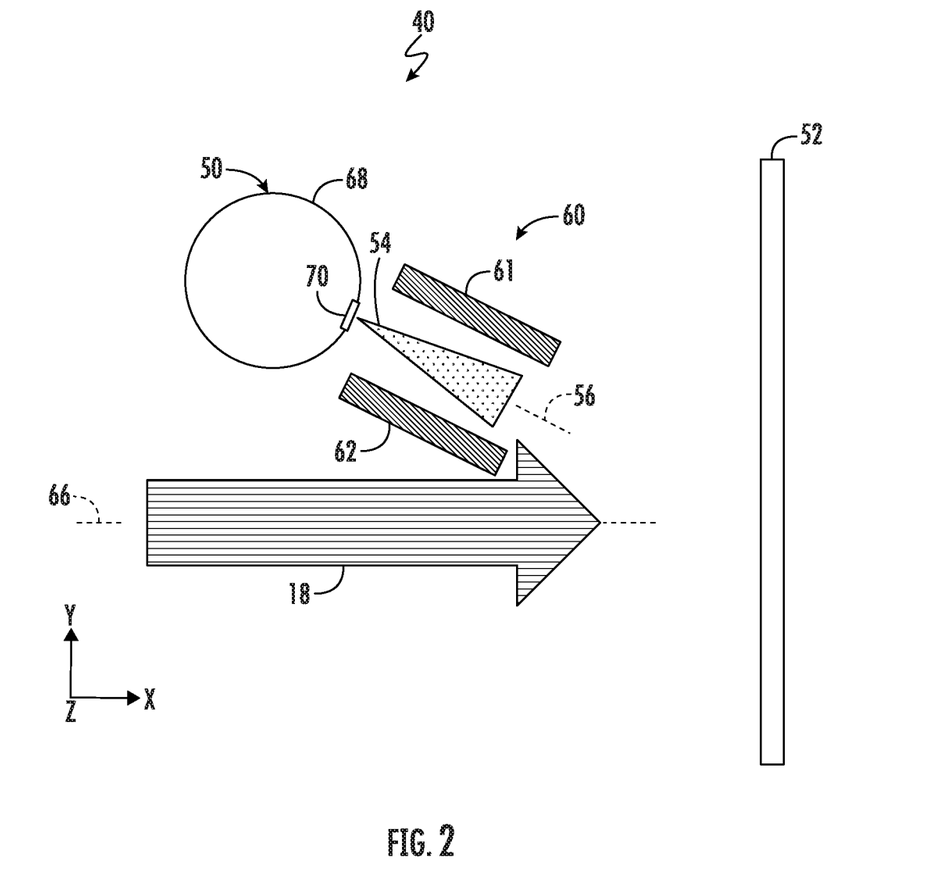
FIG. 2 is a sideview of an apparatus of FIG. 1 according to exemplary embodiments of the present disclosure.

Referring now to FIG. 2, the apparatus 40 according to exemplary embodiments will be described in greater detail. As shown, the apparatus 40 may include a radical source 50 operable to generate radicals in proximity to a wafer 52. Although non-limiting, the radical source 50 can be inductively coupled, toroidal, microwave based, or capacitively coupled or may employ a D.C. discharge. In the example shown, the radicals may be in the form of a radical band or plume 54. The radical plume 54 may be directed towards the wafer 52 along a radical direction 56. The radical plume 54 may pass through a filter 60, which is positioned between the radical source 50 and the wafer 52. As shown, the filter 60 may include a first plate 61 and a second plate 62, wherein the first and second plates 61, 62 are operable to control movement of the radicals of the radical plume 54. The first and second plates 61, 62 may be positioned on opposite sides (e.g., above and below along the y-direction) of the radical plume 54. In this embodiment, the first and second plates 61, 62 may generally extend parallel to one another. Although the first and second plates 61, 62 are shown as a set of planar or rectangular components, it will be appreciated that the first and second plates 61, 62 may take on a variety of other shapes, sizes, and/or configurations in other embodiments. For example, the positioning and shape of the first and second plates 61, 62 may be dependent on the shape of the radical plume 54, which may in turn be dependent upon a shape of one or more extraction slits or apertures 70 used to deliver the radical plume 54.

The ion source 14 (FIG. 1) may generate the ion beam 18, which is delivered toward the wafer 52, e.g., along the x-direction. As shown, the ion beam 18 passes outside (e.g., below) the filter 60. In some embodiments, the ion beam 18 is delivered along an ion beamline 66, which may intersect the radical direction 56. In other embodiments, the ion beam 18 may pass above radical source 50 and the filter 60.

Although non-limiting, the radical source 50 may be a tubular cathode containing, among other components, a chamber housing 68 containing the extraction slits or apertures 70. Although not shown for the sake of simplicity, the chamber housing 68 may further include a set of end walls, one or more gas inlets and an extraction plate.

The concentration of neutrals or radicals in the radical plume 54 may be controlled through a user interface (not shown) that governs the opening size of the extraction slits or apertures 70. The extraction slits or apertures 70 may be implemented as one or more valves. An advantage is that such adjustments to the concentration of neutrals or radicals of the radical plume 54 may be performed independently of adjustments to plasma ion density of the ion beam 18. Adjustments in plasma ion density in the processing region near the wafer 52 may further be performed by adjusting the output level of a power supply of the ion source 14. By providing independent adjustment of neutral or radical concentration in the processing region and independent adjustment of plasma ion density in the processing region, the flexibility of process control is greatly enhanced.

Figure 3:
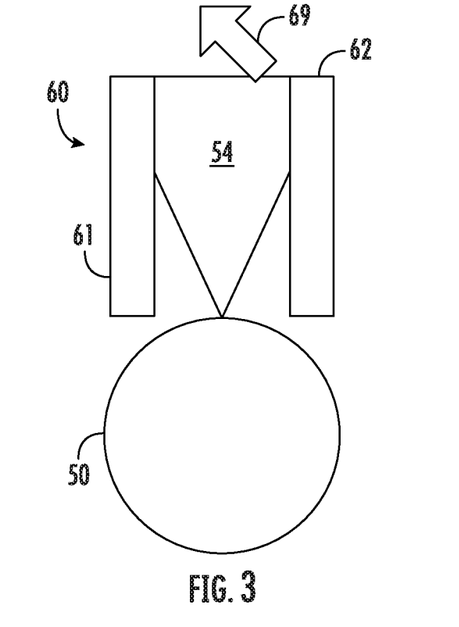
FIG. 3 demonstrates an apparatus and filter configuration according to exemplary embodiments of the present disclosure.

In some embodiments, the filter 60 may be temperature controlled. For example, as shown in FIG. 3, one or both of the first and second plates 61, 62 may be heated. It will be appreciated that a variety of power and/or heating sources (not shown) may be employed to independently control temperature of the first and second plates 61, 62. In some embodiments, one of the first and second plates 61, 62 is maintained at room temperature (e.g., approximately 20 to 25 degrees Celsius). Depending on the specific radical(s) being formed by the radical source 50, a sticking coefficient will be associated with the radical(s) and any surface material of the filter 60 the radical(s) comes into contact with. For example, lowering the temperature of the first plate 61 enhances the sticking coefficient of that plate, which filters out radicals of the radical plume impacting the plate. Conversely, heating the second plate 62 to a high temperature (e.g., 100 degrees Celsius or greater) lowers or eliminates the likelihood radicals of the radical plume 54 will attach thereto. Instead, the radicals of the radical plume 54 may be steered away from the heated second plate 62 and towards a desired area (e.g., away from the wafer), as shown by arrow 69. In one non-limiting example in which the radical is arsenic, the first plate 61 may be maintained at room temperature while the second plate 62 is raised to approximately 100-200 degrees Celsius. In another non-limiting example in which the radical is boron, the second plate 62 may be raised to approximately 400-500 degrees Celsius.

Figure 4:
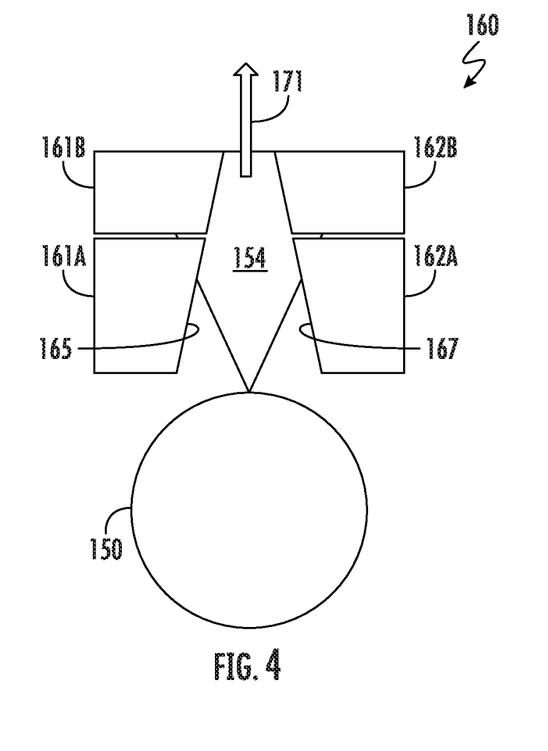
FIG. 4 demonstrates an apparatus and filter configuration according to exemplary embodiments of the present disclosure.

FIG. 4 demonstrates a filter 160 according to another embodiment of the disclosure. As shown, the filter 160 may include multiple first plates 161A-161B on one side of a radical plume 154 and multiple second plates 162A-162B on an opposite side of the radical plume 154. Although four (4) plates are shown, it'll be appreciated that a greater number of plates may be possible in other embodiments. Furthermore, an unequal number of plates may be provided on opposite sides of the radical plume 154. Still furthermore, each of the four plates may be individually powered/controlled, thus allowing for a temperature customization. For example, plates 161A-161B may be the same or different temperatures, plates 162A-162B may be the same or different temperatures, and plates 161A-161B and 162A-162B may be the same or different temperatures.

In this embodiment, the first plates 161A-161B define a first surface 165 facing the radical plume 154, and the second plates 162A-162B define a second surface 167 facing the radical plume 154. As shown, the first and second surfaces 165, 167 converge towards one another as the radical plume 154 moves away from the radical source 150. As such, the first and second surfaces 165, 167 act as a columniation of the radical plume 154. Although non-limiting, the angle and/or curvature of the first and second surfaces 165, 167 may be chosen to direct radicals in a desired direction, shown by arrow 171. It will be appreciated that the angle and/or curvature of the first and second surfaces 165, 167 may be the same or different in various embodiments.

Figure 5:
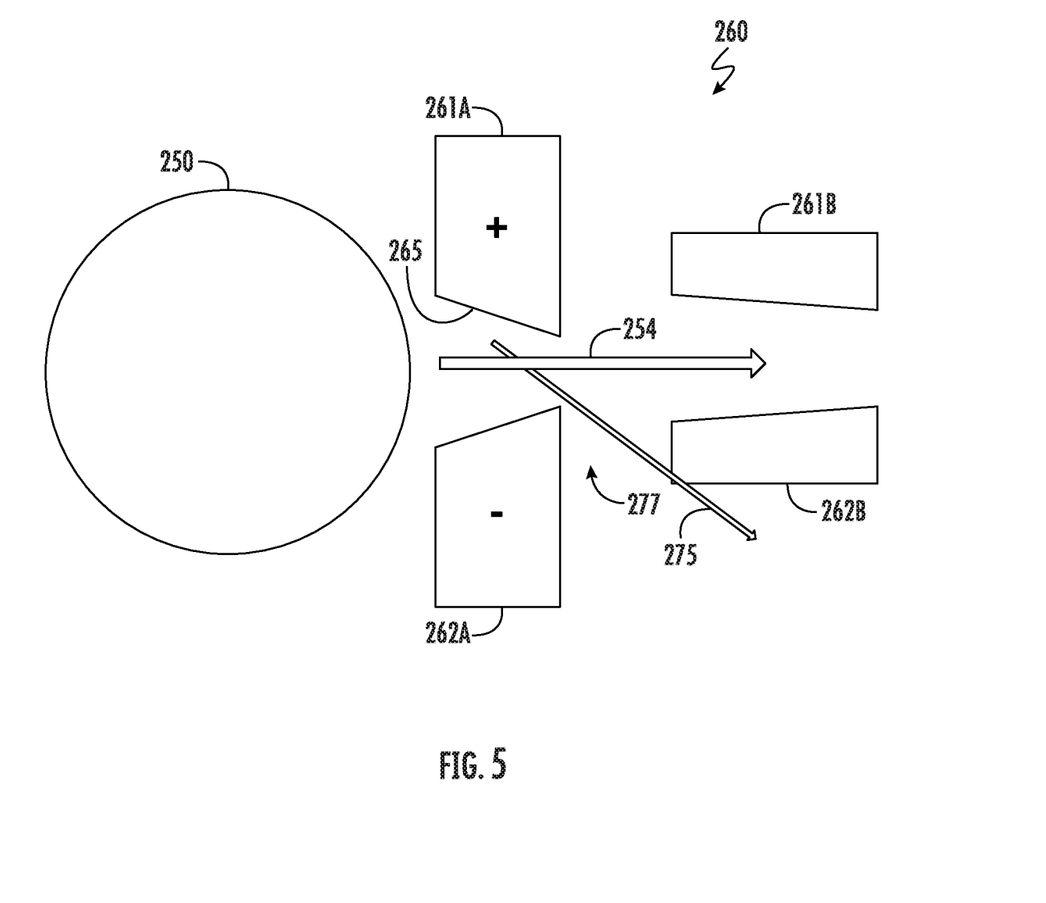
FIG. 5 demonstrates an apparatus and filter configuration according to exemplary embodiments of the present disclosure.
Figure 6:
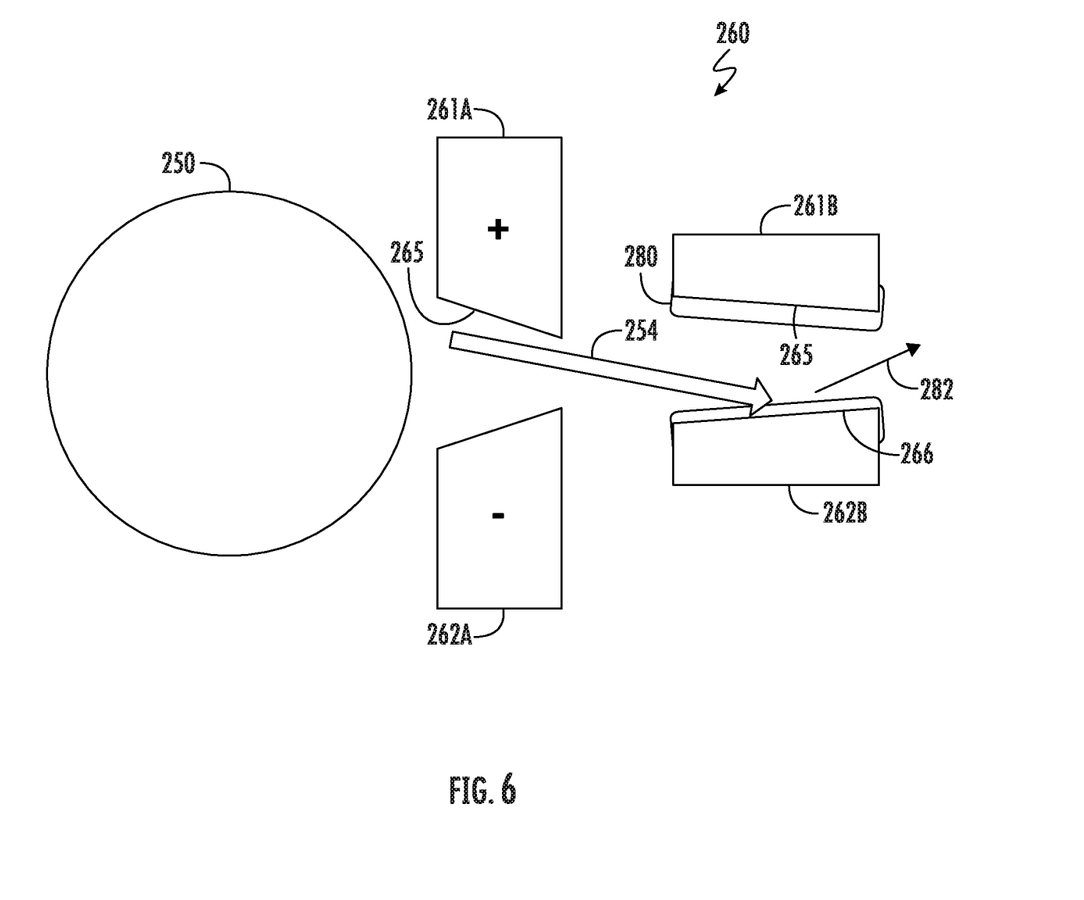
FIG. 6 demonstrates an apparatus and filter configuration according to exemplary embodiments of the present disclosure.

FIGS. 5-6 demonstrate further embodiments of the disclosure in which first plates 261A-261B and/or second plates 262A-262B of a filter 260 may be biased to a desired voltage level. Since the formation of radicals in the radical source 250 generates some ratio of ions, the charged first plates 261A-261B and/or second plates 262A-262B may steer or direct the ions 275 independently of the radicals of the radical plume 254. Although non-limiting, first plate 261A may be positively charged, while second plate 262A may be negatively charged. First plate 261B and second plate 262B may not be charged in this embodiment. As shown in FIG. 5, the ions 275, which may be hydrogen, impact first plate 261A and then travel at an angle, through an opening 277 between second plates 262A-262B. In some embodiments, the angle or curve of the first surface 265 of first plate 261A may be selected to control the angle of the ions 275.

In the embodiment of FIG. 5, first plates 261A-261B and/or second plates 262A-262B may heated. Each of the four plates may be individually controlled, thus allowing for temperature customization. In the embodiment of FIG. 6, first plates 261A-261B and/or second plates 262A-262B may be held at room temperature. Here, a radical layer 280 from the radical plume (not shown) may stick to the first and/or second surfaces 265, 266. The radical layer 280 may be subsequently sputtered off from the first and/or second surfaces 265, 266 by the ions 275. As shown, the sputtered radicals 282 may be directed at an angle to prevent the sputtered radicals 282 from landing on the wafer (not shown). This approach may be used to clean the filter 260 or as a direction CVD type of deposition chamber.

Figure 7:
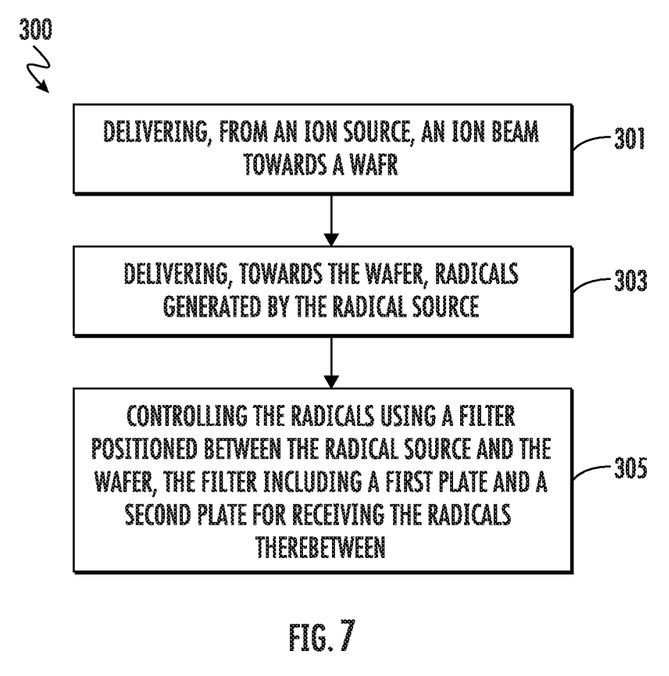
FIG. 7 is a flowchart illustrating an example method in accordance with embodiments of the present disclosure.

Referring now to FIG. 7, a flow diagram illustrating an example method 300 in accordance with the present disclosure is shown. At block 301, the method 300 may include delivering, from an ion source, an ion beam towards a wafer. At block 303, the method 300 may include delivering, towards the wafer, radicals generated by the radical source. In some embodiments, the radicals are generated and delivered as a radical band or plume traversing a radical direction.

At block 305, the method 300 may include controlling the radicals using a filter positioned between the radical source and the wafer, the filter including a first plate and a second plate for receiving the radicals therebetween. In some embodiments, the first plate and the second plate are positioned on opposite sides of the radical band. In some embodiments, the method 300 may further include heating the first plate or the second plate to prevent the radicals from attaching thereto. In some embodiments, the method may include biasing the first plate with a positive charge and biasing the second plate with a negative charge.

Although the illustrative method 300 is described above as a series of acts or events, the present disclosure is not limited by the illustrated ordering of such acts or events unless specifically stated. For example, some acts may occur in different orders and/or concurrently with other acts or events apart from those illustrated and/or described herein, in accordance with the disclosure. In addition, not all illustrated acts or events may be required to implement a methodology in accordance with the present disclosure. Furthermore, the method 300 may be implemented in association with the formation and/or processing of structures illustrated and described herein as well as in association with other structures not illustrated.

For the sake of convenience and clarity, terms such as "top," "bottom," "upper," "lower," "vertical," "horizontal," "lateral," and "longitudinal" are used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

In view of the foregoing, at least the following advantages and applications are achieved by the embodiments disclosed herein. Various embodiments may advantageously: reduce sputtering by radical environment (e.g., poison sputter yield); provide damage engineering (e.g., Rf Anneal); provide passivation at the end of processing to inhibit oxide growth after implant, selectively remove material with ion bombardment, radical reaction, and sublimation; provide deposition/selective deposition of compound materials; provide deposition by beam for trench fill with radicals selectively etching pinch off; allow hot H* for silicon surface smoothing; influence vacancy profiles (e.g., surface to deep); permit photo resist–lamp+low energy ion treatment (radicals); provide radical platen cleaning/conditioning; reduce water condensation on wafer during cold implant; provide particle clean up by making cycling wafers "sticky" which would getter particles, etc.; provide non-line of site (e.g., hot lamp, cold wafer, play with vaporization temp of like Arsenic); and/or provide selective radical reaction with 4-color for example—enhance by ion beam interaction.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A system, comprising:
    a radical source operable to generate radicals in proximity to a wafer;
    a filter positioned between the radical source and the wafer, wherein the filter includes a first plate and a second plate operable to control radicals generated by the radical source, wherein the radicals pass between the first plate and the second plate, and wherein the first and second plates are independently powered to maintain the first and second plates at different temperatures; and
    an ion source operable to deliver an ion beam to the wafer, wherein the ion beam passes outside the filter.

2. The system of claim 1, wherein the radical source is a tubular cathode.

3. The system of claim 1, the second plate extending substantially parallel to the first plate.

4. The system of claim 3, wherein the first plate is heated, and wherein the second plate is maintained approximately at room temperature.

5. The system of claim 4, wherein a temperature of the first plate is at least ten times greater than the room temperature of the second plate.

6. The system of claim 3, wherein the first plate and the second plate are positioned on opposite sides of the radicals.

7. The system of claim 3, wherein the ion beam is delivered to the wafer along a beamline, and wherein the beamline is positioned below the filter.

8. The system of claim 3, wherein the first plate is biasable to have a positive charge, and wherein the second plate is biasable to have a negative charge.

9. The system of claim 3, wherein the first plate includes a first surface facing the radicals, wherein the second plate includes a second surface facing the radicals, and wherein the first and second surfaces converge towards one another.

10. An ion implantation system, comprising:
    an ion source operable to deliver an ion beam to a wafer; and
    a radical apparatus downstream of the ion source, the radical apparatus comprising:
        a radical source operable to generate radicals in proximity to the wafer; and
        a filter positioned between the radical source and the wafer, wherein the filter includes a first plate and a second plate for receiving the radicals therebetween, and wherein the first and second plates are independently powered to maintain the first and second plates at different temperatures.

11. The ion implantation system of claim 10, wherein the radical source is a tubular cathode, and wherein the tubular cathode delivers the radicals as a radical band along a radical direction.

12. The ion implantation system of claim 10, wherein the first plate is heated, and wherein the second plate is maintained substantially at room temperature.

13. The ion implantation system of claim 12, wherein a temperature of the first plate is at least 10 times greater than the room temperature of the second plate.

14. The ion implantation system of claim 10, wherein the first plate and the second plate are positioned on opposite sides of the radicals, wherein the first plate has a positive charge, and wherein the second plate has a negative charge.

15. The ion implantation system of claim 10, wherein the ion beam is delivered to the wafer along a beamline, and wherein the beamline is positioned below the filter.

16. The ion implantation system of claim 10, wherein the first plate includes a first surface facing the radicals, wherein the second plate includes a second surface facing the radicals, and wherein the first and second surfaces converge towards one another.

* * * * *